(12) United States Patent
Wang

(10) Patent No.: US 11,489,140 B2
(45) Date of Patent: Nov. 1, 2022

(54) DISPLAY PANEL AND DISPLAY DEVICE WITH TWO BARRIER WALLS AND BOSS THEREBETWEEN

(71) Applicant: Wuhan China Star Optoelectronics Semiconductor Display Technology Co., Ltd., Hubei (CN)

(72) Inventor: Xing Wang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 239 days.

(21) Appl. No.: 15/733,184

(22) PCT Filed: Nov. 19, 2019

(86) PCT No.: PCT/CN2019/119316
§ 371 (c)(1),
(2) Date: Jun. 5, 2020

(87) PCT Pub. No.: WO2021/036017
PCT Pub. Date: Mar. 4, 2021

(65) Prior Publication Data
US 2021/0376288 A1    Dec. 2, 2021

(30) Foreign Application Priority Data
Aug. 29, 2019 (CN) .......................... 201910806979.4

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 27/3258* (2013.01); *H01L 51/56* (2013.01); *H01L 2227/323* (2013.01)

(58) Field of Classification Search
CPC . H01L 51/5253; H01L 51/56; H01L 27/3246; H01L 27/3258; H01L 2227/323
See application file for complete search history.

(56) References Cited

U.S. PATENT DOCUMENTS

| 2013/0248867 A1* | 9/2013 | Kim | ..................... H01L 27/3246 |
| | | | 438/34 |
| 2016/0064461 A1* | 3/2016 | Lee | ..................... H01L 27/3246 |
| | | | 257/40 |

(Continued)

FOREIGN PATENT DOCUMENTS

| CN | 107452894 A | 12/2017 |
| CN | 107565041 A | 1/2018 |

(Continued)

*Primary Examiner* — Lex H Malsawma
(74) *Attorney, Agent, or Firm* — Luedeka Neely Group, PC

(57) ABSTRACT

The present disclosure provides a display panel and a display device. The display panel includes a display area, a transmitted subregion, a substrate, an array layer, a first barrier wall, a second barrier wall, a light emitting layer, and a boss. The boss includes a plurality of step layers. The light emitting layer covers the boss and is discontinuous at the boss. The barrier walls and the boss prevent external substances from entering the panel through film layers, thereby effectively preventing continued diffusion of water vapor to protect the display panel.

15 Claims, 4 Drawing Sheets

(56) References Cited

U.S. PATENT DOCUMENTS

| | | | |
|---|---|---|---|
| 2017/0031323 A1* | 2/2017 | Kim | H01L 27/3246 |
| 2017/0148856 A1* | 5/2017 | Choi | H01L 27/3258 |
| 2017/0214003 A1 | 7/2017 | Lee et al. | |
| 2018/0166525 A1* | 6/2018 | Kim | G01N 27/20 |
| 2018/0254429 A1 | 9/2018 | Lee et al. | |
| 2019/0074479 A1* | 3/2019 | Lee | H01L 51/5253 |
| 2019/0245015 A1* | 8/2019 | Lee | H01L 51/56 |
| 2020/0328376 A1* | 10/2020 | Seo | H01L 51/5256 |

FOREIGN PATENT DOCUMENTS

| | | |
|---|---|---|
| CN | 109120753 A | 1/2019 |
| CN | 109285967 A | 1/2019 |
| CN | 109671870 A | 4/2019 |
| CN | 109802052 A | 5/2019 |
| CN | 110021642 A | 7/2019 |
| CN | 110034241 A | 7/2019 |
| CN | 110120464 A | 8/2019 |

\* cited by examiner

DISPLAY PANEL AND DISPLAY DEVICE WITH TWO BARRIER WALLS AND BOSS THEREBETWEEN

The present disclosure claims priority from a Chinese patent application filed with the Chinese Patent Office on Aug. 29, 2019 and with application number 201910806979.4, the title of which is "display panel and display device", and entire contents of which are incorporated herein by reference.

FIELD OF INVENTION

The present disclosure relates to the field of display technologies, and particularly relates to a display panel and a display device.

BACKGROUND OF INVENTION

Compared with liquid crystal display devices, organic light emitting devices (OLEDs) have the advantages of self-luminous, fast response, light and thin, and have become emerging technologies in the display field.

OLED display panels are widely used in field of electronic mobile terminals such as mobile phones. In order to increase a screen ratio of electronic products, a non-display area on the display panel is compressed smaller and smaller to achieve maximum display effect of the screen. In order to achieve design of a full-screen, a transmitted subregion is usually set in the display area of the display panel. The transmitted subregion has a relatively small influence on display effect of the screen. However, when setting the transmitted subregion, it is necessary to dig a hole in the display panel, which will cause sides of the organic light emitting diode device layer to be exposed to the air during cutting. In existing packaging technology, packaging effect is unsatisfactory when the hole is packaged. After the packaging, water and oxygen in the air easily penetrate into the screen, which causes the packaging of the display panel to fail and shortens service life of the display panel.

Therefore, solutions to the problems in the prior art are needed.

Technical Problems

In summary, in the existing packaging technology, the packaging effect is not ideal. After the packaging, substances such as water vapor easily enter the display panel, causing the panel packaging to fail and shortening the life of the panel.

Technical Solutions

In order to solve the above problems, the present disclosure provides a display pane and a display device to solve the problems those packaging effect is not ideal when the display panel is packaged and external substances are easy to enter the panel after packaging.

To solve the above problems, the technical solutions provided in the present disclosure are as following:

According to a first aspect of the present disclosed embodiment, a display panel is provided, the display panel includes:

a display area;

a transmitted subregion, wherein the display area surrounds the transmitted subregion;

a substrate;

an array layer disposed on the substrate, wherein the array layer comprises multiple insulating layers and multiple metal layers disposed between the insulating layers;

a first barrier wall disposed on the array layer and surrounding the transmitted subregion;

a second barrier wall disposed on the array layer and surrounding the first barrier wall;

a light emitting layer covering the array layer, the first barrier wall, and the second barrier wall;

a boss disposed between the first barrier wall and the second barrier wall, wherein the boss comprises a plurality of step layers, the light emitting layer covers the boss and the light emitting layer is discontinuous at the boss; and an encapsulation layer disposed on the light emitting layer;

wherein a length of a step surface of the step layer far from the array layer is larger than a length of a step surface of the step layer adjacent to the array layer.

According to an embodiment of the present disclosure, each of the first barrier wall and the second barrier wall comprises a planarization layer and a pixel definition layer, the planarization layer is disposed on the array layer, and the pixel definition layer is disposed on the planarization layer.

According to an embodiment of the present disclosure, the step layers comprise a first metal layer, a planarization layer, and a second metal layer, the first metal layer is disposed on the array layer, the planarization layer is disposed on the first metal layer, and the second metal layer is disposed on the planarization layer.

According to an embodiment of the present disclosure, the encapsulation layer comprises at least one organic film layer and at least one inorganic film layer, the organic film layer is disposed on the array layer and surrounds the second barrier wall, the inorganic film layer covers the organic film layer, the first barrier wall, and the second barrier wall.

According to an embodiment of the present disclosure, the display panel further includes interval columns, the interval columns are disposed on the first barrier wall.

According to an embodiment of the present disclosure, the interval columns are arranged in a ring shape and are disposed around the transmitted subregion.

According to an embodiment of the present disclosure, the light emitting layer comprises an anode layer, an organic light emitting layer, and a cathode layer; the anode layer, the organic light emitting layer, and the cathode layer are sequentially disposed.

According to a second aspect of the present disclosed embodiment, a display panel is provided, the display panel includes:

a display area;

a transmitted subregion, wherein the display area surrounds the transmitted subregion;

a substrate;

an array layer disposed on the substrate, wherein the array layer comprises multiple insulating layers and multiple metal layers disposed between the insulating layers;

a first barrier wall disposed on the array layer and surrounding the transmitted subregion;

a second barrier wall disposed on the array layer and surrounding the first barrier wall;

a light emitting layer covering the array layer, the first barrier wall, and the second barrier wall; and a boss disposed between the first barrier wall and the second barrier wall, wherein the boss comprises a plurality of step layers, the light emitting layer covers the boss and the light emitting layer is discontinuous at the boss.

According to an embodiment of the present disclosure, a length of a step surface of the step layer far from the array layer is larger than a length of a step surface of the step layer adjacent to the array layer.

According to an embodiment of the present disclosure, each of the first barrier wall and the second barrier wall comprises a planarization layer and a pixel definition layer, the planarization layer is disposed on the array layer, and the pixel definition layer is disposed on the planarization layer.

According to an embodiment of the present disclosure, the step layers comprise a first metal layer, a planarization layer, and a second metal layer, the first metal layer is disposed on the array layer, the planarization layer is disposed on the first metal layer, and the second metal layer is disposed on the planarization layer.

According to an embodiment of the present disclosure, the display panel further includes an encapsulation layer, the encapsulation layer is disposed on the light emitting layer.

According to an embodiment of the present disclosure, the encapsulation layer comprises at least one organic film layer and at least one inorganic film layer, the organic film layer is disposed on the array layer and surrounds the second barrier wall, the inorganic film layer covers the organic film layer, the first barrier wall, and the second barrier wall.

According to an embodiment of the present disclosure, the display panel further includes interval columns, the interval columns are disposed on the first barrier wall.

According to an embodiment of the present disclosure, the interval columns are arranged in a ring shape and are disposed around the transmitted subregion.

According to an embodiment of the present disclosure, the light emitting layer comprises an anode layer, an organic light emitting layer, and a cathode layer; the anode layer, the organic light emitting layer, and the cathode layer are sequentially disposed.

According to a third aspect of the present disclosed embodiment, a display device is provided, the display device includes a display panel, and the display panel includes:

a display area;

a transmitted subregion, wherein the display area surrounds the transmitted subregion;

a substrate;

an array layer disposed on the substrate, wherein the array layer comprises multiple insulating layers and multiple metal layers disposed between the insulating layers;

a first barrier wall disposed on the array layer and surrounding the transmitted subregion;

a second barrier wall disposed on the array layer and surrounding the first barrier wall;

a light emitting layer covering the array layer, the first barrier wall, and the second barrier wall; and a boss disposed between the first barrier wall and the second barrier wall, wherein the boss comprises a plurality of step layers, the light emitting layer covers the boss and the light emitting layer is discontinuous at the boss.

According to an embodiment of the present disclosure, a length of a step surface of the step layer far from the array layer is larger than a length of a step surface of the step layer adjacent to the array layer.

According to an embodiment of the present disclosure, the display panel further includes an encapsulation layer, the encapsulation layer is disposed on the light emitting layer.

Beneficial Effects

In summary, beneficial effects of the present disclosed embodiments are:

In the display panel and the display device provided in the present disclosure, the first barrier wall and the second barrier wall are disposed adjacent to the transmitted subregion, and the boss is provided between the first barrier wall and the second barrier wall. When the film layers are encapsulated, the first barrier wall and the second barrier wall can effectively form a blocking structure to prevent outside substances from entering the display panel through the film layers. Meanwhile, the film layers of the display panel are discontinuous at the boss to form a gap structure. In this way, when external substances pass through the film layers of the gap structure, they will not penetrate further into the display panel, thereby effectively blocking continued diffusion of water vapor, protecting the display panel, and increasing service life of the display panel.

DETAILED DESCRIPTION OF EMBODIMENTS

Following descriptions of the embodiments are with reference to the attached drawings, which are used to illustrate specific embodiments that can be implemented by the present disclosure.

Figure 1:
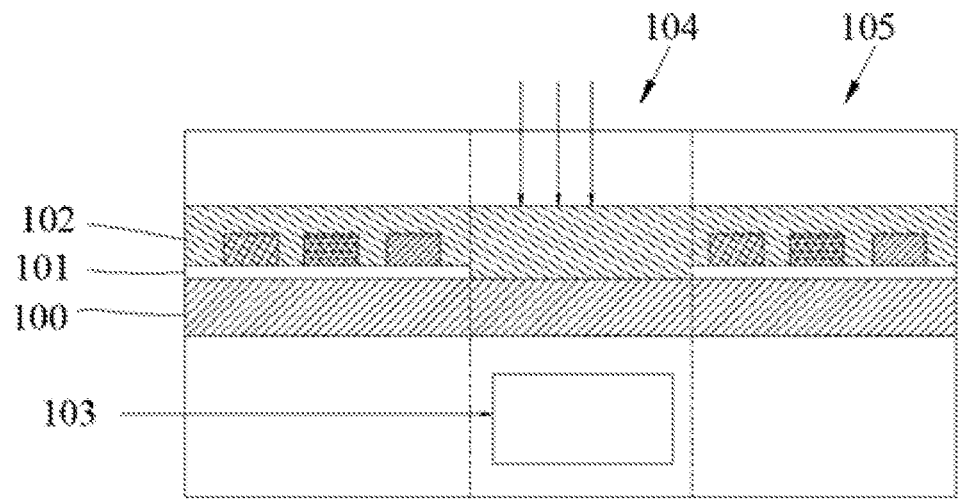
FIG. 1 is a schematic view of a display panel in prior art.

In the embodiment of the present disclosure, as shown in FIG. 1, it is a schematic view of a display panel in the prior art. The display panel includes a substrate 100, an array layer 101, a light emitting layer 102, and a encapsulation film layer 103. Meanwhile, the display panel further includes a transmitted subregion 104 and a display area 105. The display area 105 surrounds the transmitted subregion 104. In order to realize camera function, the transmitted subregion 104 is formed by digging an opening in the display panel, and a camera 103 is placed under the substrate 100 corresponding to the transmitted subregion 104. External light enters the camera through the transmitted subregion 104, thereby realizing the camera function.

Because material in the organic light emitting layer 102 is very sensitive to water vapor and oxygen in outside air, therefore, after the display panel is dug, it is necessary to seal the opening. If the seal is not tight, substances such as oxygen or water from outside will penetrate into the display panel from the film layer, which will affect luminous effect of the display panel and reduce life of the panel.

Figure 2:
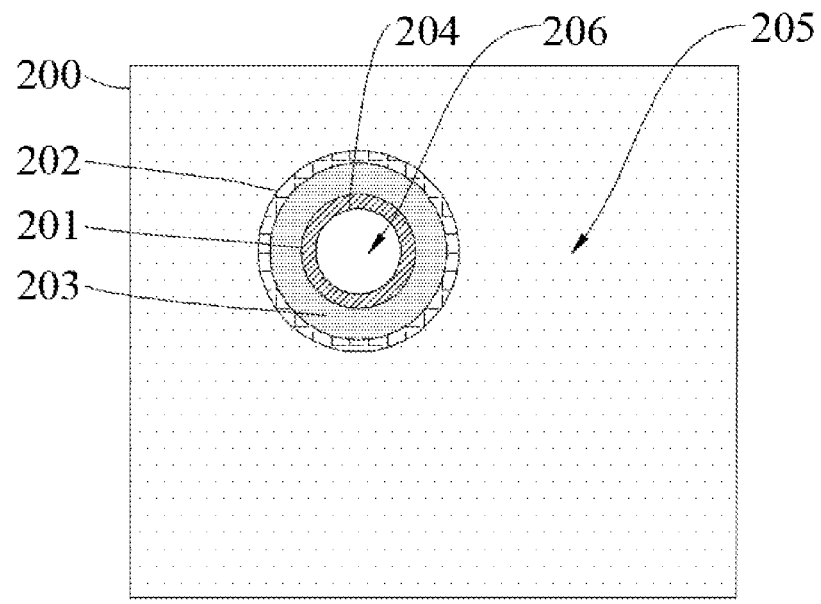
FIG. 2 is a schematic view of a panel structure of a display panel according to an embodiment of the present disclosure.

In order to effectively steal the opening, a display panel is designed as shown in FIG. 2, it is a schematic view of a panel structure of a display panel according to an embodiment of the present disclosure. The display panel 200 includes a display area 205 and a transmitted subregion 206. The display area 205 surrounds the transmitted subregion 206. Meanwhile, the transmitted subregion 206 includes an opening 204. External light enters the camera inside the panel through the opening 204. When setting, multiple identical openings 204 may be opened on the display panel 200.

The display panel 200 further includes a first barrier wall 201 and a second barrier wall 202 in the display area 205 and adjacent to the opening 204. The first barrier wall 201 surrounds the opening 204 and is shaped as a circle ring. The second barrier wall 202 surrounds the first barrier wall 201 and is shaped as a circle ring. In order to simplify production process, the opening 204, the first barrier wall 201, and the second barrier wall 202 may be set as concentric circles, and a center of the concentric circles is located on a center of opening 204. Meanwhile, the display panel 200 further includes an interval area 203 disposed between the first barrier wall 201 and the second barrier wall 202. The interval area 203 separates the first barrier wall 201 and the second barrier wall 202.

Figure 3:
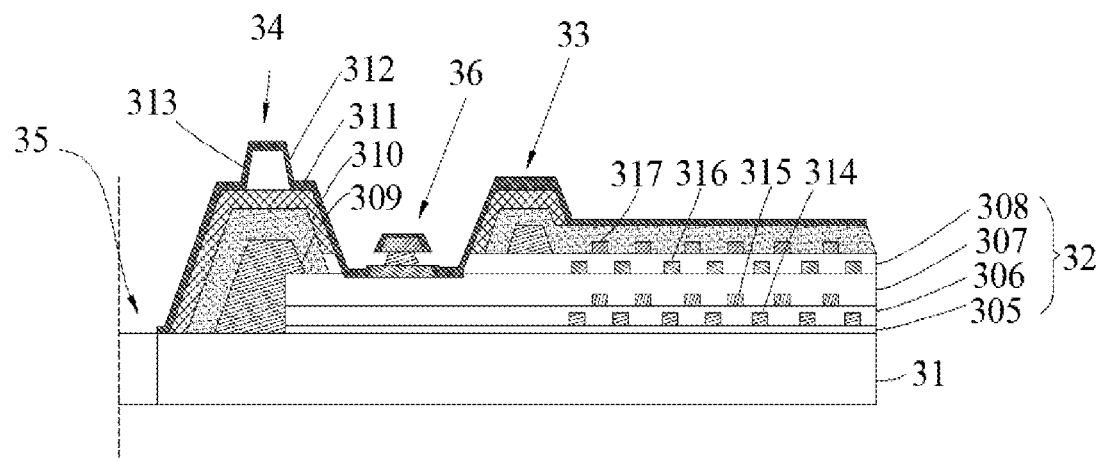
FIG. 3 is a schematic view of the display panel according to an embodiment of the present disclosure.

Specifically, as shown in FIG. 3, it is a schematic view of the display panel according to an embodiment of the present disclosure. The display panel includes a substrate 31 and an array layer 32. The array layer 32 is disposed on the substrate 31. The substrate is made of materials of glass, polyimide, polycarbonate, and other polymer materials. Meanwhile, the substrate 31 may be translucent, transparent, or opaque. In the embodiment of the present disclosure, the substrate 31 further includes a flexible substrate. Furthermore, the substrate 31 further includes a buffer layer. The buffer layer may include a layered structure with multiple organic layers and inorganic layers. So, the substrate 31 can effectively block diffusion of oxygen, moisture, and other impurities into the panel through substrate 31.

The array layer 32 includes multiple insulating layers, multiple metal layers disposed between the insulating layers, a plurality of thin film transistors disposed between the insulating layers, and a pixel circuit composed of the thin film transistors. Specifically, the array layer 32 includes a first gate insulating layer 305, a second gate insulating layer 306, an inorganic insulating layer 307, and a passivation layer 308. Wherein, the second gate insulating layer 306 is disposed on the first gate insulating layer 305. The inorganic insulating layer 307 is disposed on the second gate insulating layer 306. The passivation layer 308 is disposed on the inorganic insulating layer 307. Meanwhile, a first gate electrode layer 314, a second gate electrode layer 315, a first source-drain metal layer 316, and a second source-drain metal layer 317 are provided between the insulating layers. The first gate electrode layer 314 is disposed on the first gate insulating layer 305. The second gate insulating layer 306 covers the first gate electrode layer 314. The second gate electrode layer 315 is disposed on the second gate insulating layer 306. The inorganic insulating layer 307 covers the second gate electrode layer 315. The first source-drain metal layer 316 is disposed on the inorganic insulating layer 307, and the passivation layer 308 covers the first source-drain metal layer 316. The second source-drain metal layer 317 is disposed on the inorganic insulating layer 307. The above insulating layers and metal layers constitute the structures of the thin film transistors.

The array layer 32 further includes an active layer of the thin film transistor. The active layer includes a source region and a drain region formed by doping N-type impurity ions or P-type impurity ions. A channel region is provided between the source region and the drain region.

Wherein, each of the above-mentioned insulating layers may be made of an insulating inorganic layer or an insulating organic layer, such as silicon oxide or silicon nitride.

The passivation layer 308 is disposed on the thin film transistor. Specifically, the passivation layer 308 is disposed on the first source-drain metal layer 316. The passivation layer 308 may be an inorganic layer or an organic layer, such as silicon oxide or silicon nitride.

Specifically, the display panel further includes a first planarization layer 309, a second planarization layer 310, and a pixel definition layer 311. The first planarization layer 309 is disposed on the array layer 32, and specifically disposed on the passivation layer 308. The second planarization layer 310 is disposed on the first planarization layer 309. The pixel definition layer 311 is disposed on the second planarization layer 310.

The first planarization layer 309 and the second planarization layer 310 are made of organic materials, such as polyimide.

Wherein, in the embodiment of the present disclosure, when the first planarization layer 309, the second planarization layer 310, the pixel definition layer 311, and other film layers are provided, the structure of each film layer is different, and the film layers are stacked on each other. The stacked film layers are disposed around the transmitted subregion 35 to form wall structures of the first barrier wall 34 and the second barrier wall 33. When the external water vapor enters the display panel along the film layers in the transmitted subregion 35, because the barrier walls are slightly convex structures, the first barrier wall 34 and the second barrier wall 33 can effectively block the entered water vapor, thereby protecting the display panel and ensuring normal display of the screen.

The display panel of the embodiment of the present disclosure further includes interval columns 313. The interval columns 313 are disposed on the second planarization layer 310. Specifically, the interval columns 313 are disposed on portions of the first barrier wall 34 which are corresponding to the second planarization layer 310. Suh that, the interval columns 313, the second planarization layer 310, and the first planarization layer 309 form the first barrier wall 34. Meanwhile, the interval columns 313 also serve as fixed supports. When the panel is transported or shaken, the interval columns 313 can protect the internal film layers and prevent the internal film layers from being damaged. The interval columns 313 are arranged in a ring shape and are disposed around the transmitted subregion 35. The interval columns 313 are made of flexible material which has a certain elastic recovery effect.

In order to further prevent water vapor from entering the display panel from the transmitted subregion 35 along the film layers, in the embodiment of the present disclosure, a boss 36 is further provided between the first barrier wall 34 and the second barrier wall 33.

Preferably, when the first source-drain metal layer 316, the second source-drain metal layer 317, the first planarization layer 309, and the second planarization layer 310 of the display panel are etched, a space between the first barrier wall 34 and the second barrier wall 33 is also etched accordingly. When the first source-drain metal layer 316 of the display panel is manufactured, the patterned first source-drain metal layer 316 is also formed between the first barrier wall 34 and the second barrier wall 33. When the first planarization layer 309 of the display panel is manufactured, the patterned first planarization layer 309 is also formed between the first barrier wall 34 and the second barrier wall 33. When the second source-drain metal layer 317 of the display panel is manufactured, the patterned second source-drain metal layer 317 is also formed between the first barrier wall 34 and the second barrier wall 33. After patterning is completed, a structure of the boss 36 composed of the first source-drain metal layer 316, the first planarization layer 309, and the second source-drain metal layer 317 will be formed.

The boss 36 includes a plurality of step layers. The boss 36 can further prevent water vapor. In order to maximize blocking effect, the layers of the boss 36 are further processed. Specifically, the first planarization layer 309 between the first source-drain metal layer 316 and the second source-drain metal layer 317 is etched by a dry etching process, so that a side between the first planarization layer 309 and the first source-drain metal layer 316 and a side between the first planarization layer 309 and the second source-drain metal layer 317 are discontinuous to form gap structures. That is, the three film layers form an approximately "I"-shaped structure. Because the first planarization layer 309 is an organic film layer, the first source-drain metal layer 316 and the second source-drain metal layer 317 are metal layers, and there is a large selection ratio between the metal layer and the organic film layer in etching process, it is beneficial to form the gap structures on the organic film layer.

Because the sidewalls of the boss 36 are discontinuous, when other film layers are provided on the boss, the film layers are broken on the sidewalls of the boss 36, such that making the film layers discontinuous.

Preferably, in each step layer of the boss 36, a length of a step surface of the step layer far from the array layer 32 is larger than a length of a step surface of the step layer adjacent to the array layer 32.

Alternatively, a length of a step surface of the step layer in middle of the boss 36 is smaller than the length of the step surface of the step layer far from the array layer 32. That is, a cross-sectional length of the second source-drain metal layer 317 in the middle of the boss 36 is larger than a cross-sectional length of the first planarization layer 309. Preferably, a broken size of the first planarization layer is 0-2 um.

Figure 4A:
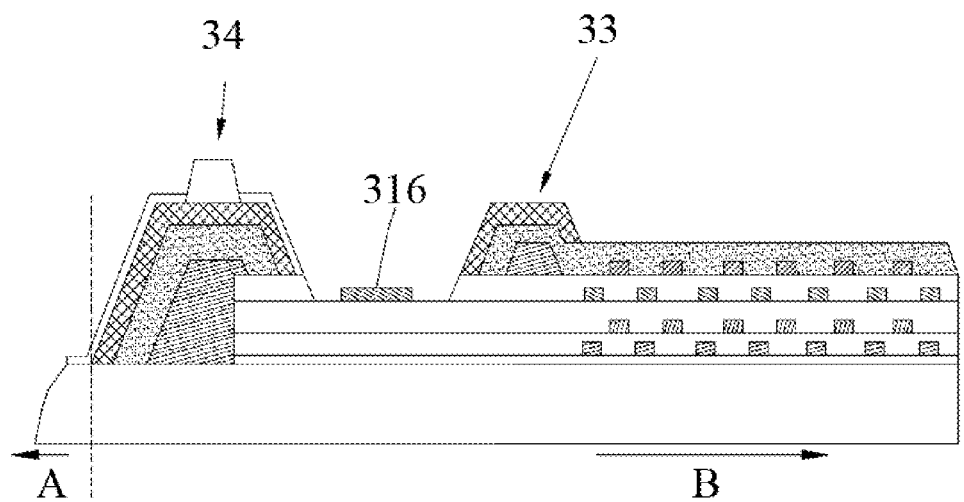
FIG. 4A is a diagram view of a preparation technics of a first source-drain metal layer according to an embodiment of the present disclosure.
Figure 4B:
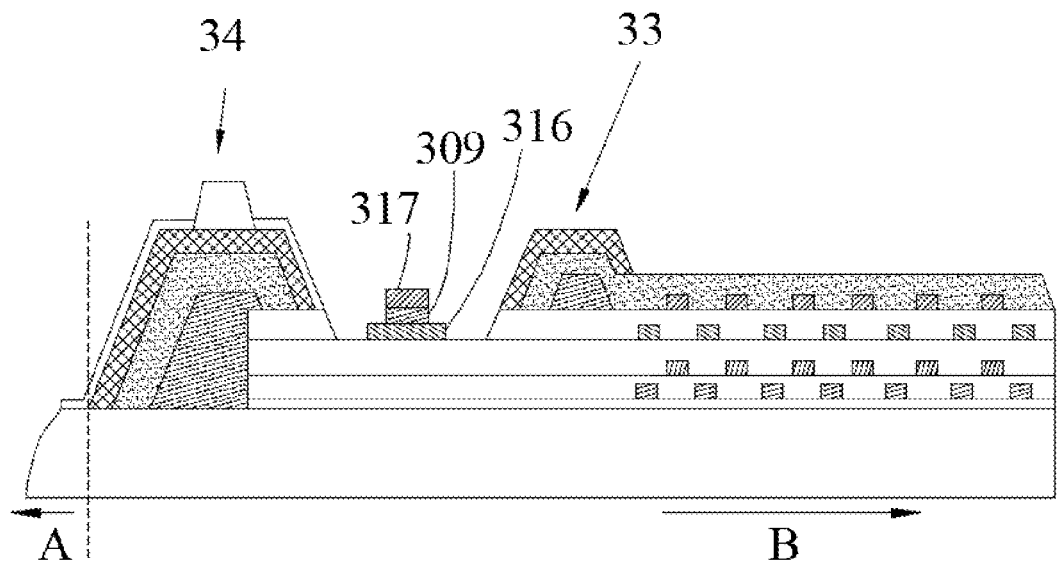
FIG. 4B is a diagram view of a preparation technics of a boss according to an embodiment of the present disclosure.

Specifically, each step layer of the boss 36 is provided as shown in FIG. 4A and FIG. 4B. FIG. 4A is a diagram view of a preparation technics of the first source-drain metal layer according to an embodiment of the present disclosure. FIG. 4B is a diagram view of a preparation technics of the boss according to an embodiment of the present disclosure. When the first source-drain metal layer 316 in the display area B of the display panel is etched, the space between the first barrier wall 34 and the second barrier wall 33 is also patterned to form the first source-drain metal layer 316. Similarly, when the first planarization layer 309 and the second source-drain metal layer 317 are prepared, they are also patterned between the first barrier wall 34 and the second barrier wall 33, and finally a boss structure in FIG. 4B is formed.

Figure 4C:
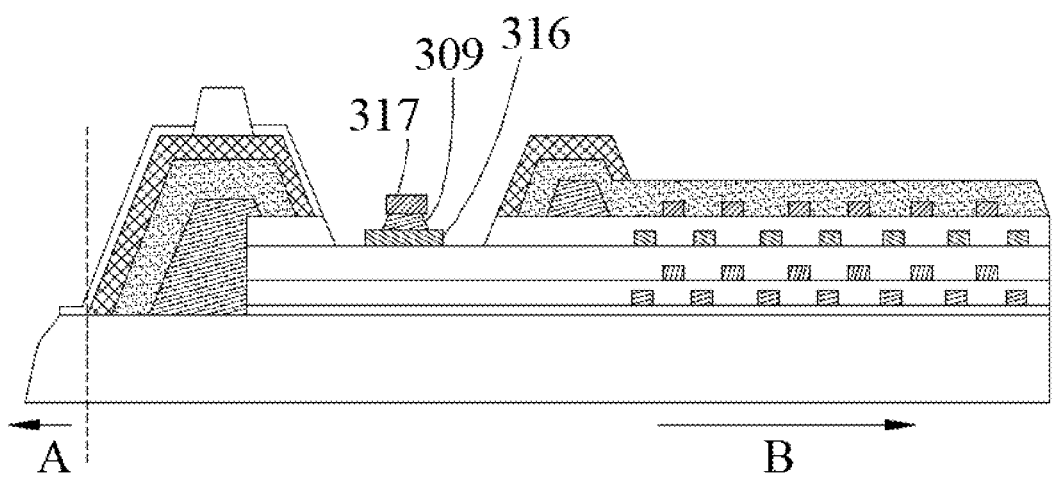
FIG. 4C is a diagram view of an etching process of a planarization layer according to an embodiment of the present disclosure.

As shown in FIG. 4C, it is a diagram view of an etching process of the planarization layer according to an embodiment of the present disclosure. During etching process of the first planarization layer 309, a sidewall of the first planarization layer 309 is etched by a dry etching process to form an inclined sidewall, and to make a fracture surface of the first planarization layer 309 which is in contact with the second source-drain metal layer 317 forming the gap structure. A manufacturing method of the boss in the embodiment of the present disclosure is simple, and the boss structure can be etched only by adding a photomask to the area between the first barrier wall 34 and the second barrier wall 33.

Figure 5:
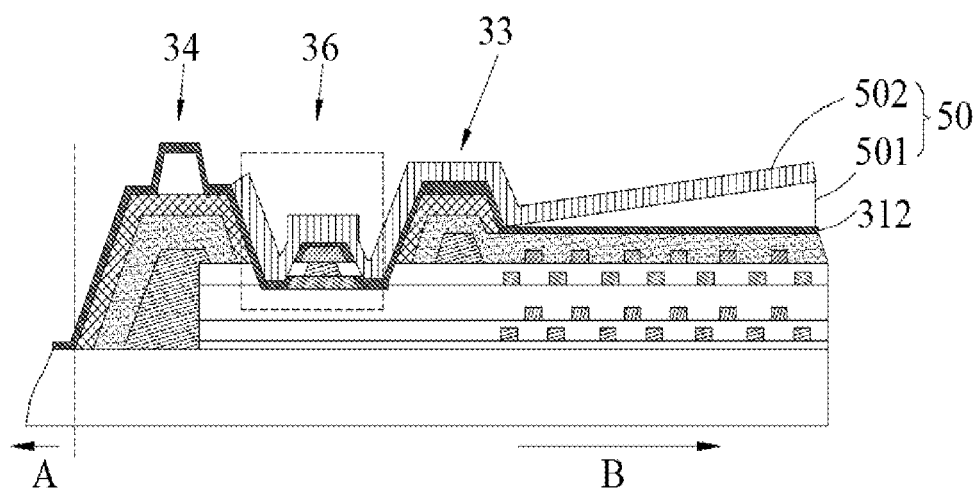
FIG. 5 is another schematic view of the display panel according to an embodiment of the present disclosure.

As shown in FIG. 5, it is another schematic view of the display panel according to an embodiment of the present disclosure. With reference to FIG. 3 and FIGS. 4A-4C, the display panel in the embodiment of the present disclosure further includes a light emitting layer 312. The light emitting layer 312 is disposed on the array layer 32. Specifically, the light emitting layer 312 is disposed on the pixel definition layer 311. Meanwhile, the light emitting layer 312 covers the first barrier wall 34, the second barrier wall 33, and the array layer 32. The light emitting layer 312 further includes an anode layer, an organic light emitting layer, and a cathode layer. The anode layer, the organic light emitting layer, and the cathode layer are sequentially disposed in a direction away from the array layer. Specific film layers of the light emitting layer 312 in FIG. 3 is not labeled. A thickness of the light emitting layer 312 is relatively thin, and the thickness is less than 1 um.

Preferably, because the boss 36 is provided in the embodiment of the present disclosure, and breaks are formed between the step layers of the boss 36, the film layers of the light emitting layer 312 are discontinuous at the boss 36. When external water vapor penetrates into the display panel along the light emitting layer 312, because the light emitting layer 312 is discontinuous at the boss 36, it effectively blocks continued diffusion of water vapor, thereby effectively protecting the display area B and the display panel.

Furthermore, the display panel provided in the embodiment of the present disclosure further includes an encapsulation layer 50. The encapsulation layer 50 is disposed on the light emitting layer 312. Wherein, the encapsulation layer 50 may include at least one organic film layer 501 and at least one inorganic film layer 502. The organic film layer 501 is disposed around the second barrier wall 33. An edge of an orthographic projection of the organic film layer 501 on the display area B of the display panel is located on a side of the second barrier wall 33 adjacent to the display area B. The inorganic film layer 502 completely covers the organic film layer 501, the first barrier wall 34, the second barrier wall 33, and the light emitting layer 312.

Meanwhile, the embodiment of the present disclosure further provides a display device. The display device includes the display panel provided in the embodiment of the present disclosure. The barrier wall structure and the boss structure provided inside the display panel effectively block outside water from entering the panel, which protects the display panel and improves service life of the display panel.

The display panel and display device provided by the embodiments of the present disclosure have been described in detail above. The descriptions of the above embodiments are only used to help understand the technical solution of the present disclosure and its core ideas. Those of ordinary skill in the art should understand that they can still modify the technical solutions described in the foregoing embodiments, and these modifications or replacements do not deviate the essence of the corresponding technical solutions from the scope of the technical solutions of the embodiments of the present disclosure.

What is claimed is:
1. A display panel, comprising:
a display area;
a transmitted subregion, wherein the display area surrounds the transmitted subregion;
a substrate;
an array layer disposed on the substrate, wherein the array layer comprises multiple insulating layers and multiple metal layers disposed between the insulating layers;
a first barrier wall disposed on the array layer and surrounding the transmitted subregion;

a second barrier wall disposed on the array layer and surrounding the first barrier wall, wherein a groove is defined between the first barrier wall and the second barrier wall;

a light emitting layer covering the array layer, the first barrier wall, and the second barrier wall;

a boss disposed in the groove, wherein the boss comprises a plurality of step layers, the light emitting layer covers the boss and the light emitting layer is discontinuous at the boss; and an encapsulation layer disposed on the light emitting layer;

wherein a length of a step surface of a step layer far from the array layer is larger than a length of a step surface of a step layer adjacent to the array layer, each of the first barrier wall and the second barrier wall comprises a first planarization layer and a pixel definition layer, the first planarization layer is disposed on a whole of the array layer and is made of organic materials, the pixel definition layer is disposed on the first planarization layer, the encapsulation layer comprises at least one organic film layer and at least one inorganic film layer, and the at least one organic film layer does not cover the first barrier wall and the boss.

2. The display panel as claimed in claim 1, wherein the step layers comprise a first metal layer, a second planarization layer, and a second metal layer, the first metal layer is disposed on the array layer, the second planarization layer is disposed on the first metal layer, and the second metal layer is disposed on the second planarization layer.

3. The display panel as claimed in claim 1, wherein the inorganic film layer covers the organic film layer, the first barrier wall, and the second barrier wall.

4. The display panel as claimed in claim 1, further comprising interval columns, wherein the interval columns are disposed on the first barrier wall.

5. The display panel as claimed in claim 4, wherein the interval columns are arranged in a ring shape and are disposed around the transmitted subregion.

6. The display panel as claimed in claim 1, wherein the light emitting layer comprises an anode layer, an organic light emitting layer, and a cathode layer; the anode layer, the organic light emitting layer, and the cathode layer are sequentially disposed.

7. A display panel, comprising:
a display area;
a transmitted subregion, wherein the display area surrounds the transmitted subregion;
a substrate;
an array layer disposed on the substrate, wherein the array layer comprises multiple insulating layers and multiple metal layers disposed between the insulating layers;
a first barrier wall disposed on the array layer and surrounding the transmitted subregion;
a second barrier wall disposed on the array layer and surrounding the first barrier wall, wherein a groove is defined between the first barrier wall and the second barrier wall;
a light emitting layer covering the array layer, the first barrier wall, and the second barrier wall;
a boss disposed in the groove, wherein the boss comprises a plurality of step layers, the light emitting layer covers the boss and the light emitting layer is discontinuous at the boss, and
an encapsulation layer disposed on the light emitting layer;

each of the first barrier wall and the second barrier wall comprises a first planarization layer and a pixel definition layer, the first planarization layer is disposed on a whole of the array layer and is made of organic materials, the pixel definition layer is disposed on the first planarization layer, the encapsulation layer comprises at least one organic film layer and at least one inorganic film layer, and the at least one organic film layer does not cover the first barrier wall and the boss.

8. The display panel as claimed in claim 7, wherein a length of a step surface of a far from the array layer is larger than a length of a step surface of a step layer adjacent to the array layer.

9. The display panel as claimed in claim 7, wherein the step layers comprise a first metal layer, a second planarization layer, and a second metal layer, the first metal layer is disposed on the array layer, the second planarization layer is disposed on the first metal layer, and the second metal layer is disposed on the second planarization layer.

10. The display panel as claimed in claim 7, wherein the inorganic film layer covers the organic film layer, the first barrier wall, and the second barrier wall.

11. The display panel as claimed in claim 7, further comprising interval columns, wherein the interval columns are disposed on the first barrier wall.

12. The display panel as claimed in claim 11, wherein the interval columns are arranged in a ring shape and are disposed around the transmitted subregion.

13. The display panel as claimed in claim 7, wherein the light emitting layer comprises an anode layer, an organic light emitting layer, and a cathode layer; the anode layer, the organic light emitting layer, and the cathode layer are sequentially disposed.

14. A display device, comprising a display panel, and the display panel comprising:
a display area;
a transmitted subregion, wherein the display area surrounds the transmitted subregion;
a substrate;
an array layer disposed on the substrate, wherein the array layer comprises multiple insulating layers and multiple metal layers disposed between the insulating layers;
a first barrier wall disposed on the array layer and surrounding the transmitted subregion;
a second barrier wall disposed on the array layer and surrounding the first barrier wall, wherein a groove is defined between the first barrier wall and the second barrier wall;
a light emitting layer covering the array layer, the first barrier wall, and the second barrier wall;
a boss disposed in the groove, wherein the boss comprises a plurality of step layers, the light emitting layer covers the boss and the light emitting layer is discontinuous at the boss, and
an encapsulation layer disposed on the light emitting layer;
wherein each of the first barrier wall and the second barrier wall comprises a planarization layer and a pixel definition layer, the planarization layer is disposed on a whole of the array layer and is made of organic materials, the pixel definition layer is disposed on the planarization layer,
the encapsulation layer comprises at least one organic film layer and at least one inorganic film layer, and the at least one organic film layer does not cover the first barrier wall and the boss.

15. The display device as claimed in claim 14, wherein a length of a step surface of a step layer far from the array layer is larger than a length of a step surface of a step layer adjacent to the array layer.

* * * * *